United States Patent
Delacruz et al.

(10) Patent No.: US 12,500,209 B2
(45) Date of Patent: Dec. 16, 2025

(54) EMBEDDED ORGANIC INTERPOSER FOR HIGH BANDWIDTH

(71) Applicant: Adeia Semiconductor Technologies LLC, San Jose, CA (US)

(72) Inventors: Javier A. Delacruz, San Jose, CA (US); Belgacem Haba, Saratoga, CA (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 539 days.

(21) Appl. No.: 17/362,712

(22) Filed: Jun. 29, 2021

(65) Prior Publication Data

US 2021/0327851 A1    Oct. 21, 2021

Related U.S. Application Data

(63) Continuation of application No. 16/555,127, filed on Aug. 29, 2019, now Pat. No. 11,063,017, which is a
(Continued)

(51) Int. Cl.
*H01L 25/065* (2023.01)
*H01L 23/498* (2006.01)
(Continued)

(52) U.S. Cl.
CPC .... *H01L 25/0655* (2013.01); *H01L 23/49894* (2013.01); *H01L 23/5383* (2013.01);
(Continued)

(58) Field of Classification Search
CPC ........... H01L 2224/16225; H01L 23/15; H01L 23/49894; H01L 23/5383; H01L 23/5384;
(Continued)

(56) References Cited

U.S. PATENT DOCUMENTS 5,347,428 A * 9/1994 Carson ............... H01L 25/0657
361/728
6,080,529 A * 6/2000 Ye ..................... H01L 21/32139
430/311
(Continued)

FOREIGN PATENT DOCUMENTS

WO    2018004692 A1    1/2018

OTHER PUBLICATIONS

Sakai et al. ("Design and Demonstration of Large 2.5D Glass Interposer for High Bandwidth Applications," Proceedings of the IEEE CPMT Symposium Japan 2014), p. 138-141 (Year: 2014).*
(Continued)

*Primary Examiner* — Britt D Hanley
*Assistant Examiner* — Kevin Quinto
(74) *Attorney, Agent, or Firm* — HALEY GUILIANO LLP

(57) ABSTRACT

Embedded organic interposers for high bandwidth are provided. Example embedded organic interposers provide thick conductors with more dielectric space, and more routing layers of such conductors than conventional interposers, in order to provide high bandwidth transmission capacity over longer spans. The embedded organic interposers provide high bandwidth transmission paths between components such as HBM, HBM2, and HBM3 memory stacks, and other components. To provide the thick conductors and more routing layers for greater transmission capacity, extra space is achieved by embedding the organic interposers in the core of the package. Example embedded organic interposers lower a resistive-capacitive (RC) load of the routing layers to provide an improved data transfer rate of 1 gigabits per second over at least a 6 mm span, for example. The embedded interposers are not limited to use with memory modules.

18 Claims, 12 Drawing Sheets

Related U.S. Application Data continuation of application No. 15/499,557, filed on Apr. 27, 2017, now Pat. No. 10,403,599.

(51) Int. Cl.
| | |
|---|---|
| *H01L 23/538* | (2006.01) |
| *H01L 25/00* | (2006.01) |
| *H01L 25/16* | (2023.01) |
| *H05K 1/02* | (2006.01) |
| *H05K 3/46* | (2006.01) |
| *H01L 23/15* | (2006.01) |
| *H01L 25/18* | (2023.01) |
| *H05K 1/18* | (2006.01) |

(52) U.S. Cl.
CPC .............. *H01L 25/16* (2013.01); *H01L 25/50* (2013.01); *H05K 1/0243* (2013.01); *H05K 3/4694* (2013.01); *H01L 23/15* (2013.01); *H01L 23/5384* (2013.01); *H01L 25/18* (2013.01); *H05K 1/185* (2013.01); *H05K 2201/09227* (2013.01); *H05K 2201/10015* (2013.01); *H05K 2201/10159* (2013.01); *H05K 2201/10522* (2013.01); *H05K 2201/10674* (2013.01)

(58) Field of Classification Search
CPC ..... H01L 25/0655; H01L 25/16; H01L 25/18; H01L 25/50; H01L 2924/15192; H01L 2924/15311; H01L 23/49827; H01L 21/4857; H01L 21/486; H01L 23/49816; H01L 23/49822; H01L 23/49888; H01L 24/13; H01L 24/16; H01L 24/32; H01L 2224/16235; H01L 2224/32225; H01L 2224/73253; H01L 2224/94; H01L 2924/15321; H05K 1/0243; H05K 1/185; H05K 2201/09227; H05K 2201/10015; H05K 2201/10159; H05K 2201/10522; H05K 2201/10674; H05K 3/4694; H10N 60/81; H10N 69/00; G06N 10/40

See application file for complete search history.

(56) References Cited

U.S. PATENT DOCUMENTS

| | | | |
|---|---|---|---|
| 6,449,170 B1* | 9/2002 | Nguyen | H01L 23/5382 |
| | | | 361/767 |
| 6,461,895 B1 | 10/2002 | Liang et al. | |
| 8,188,378 B2 | 5/2012 | Sakamoto et al. | |
| 9,368,450 B1 | 6/2016 | Gu et al. | |
| 9,418,965 B1* | 8/2016 | Li | H01L 21/4857 |
| 9,432,298 B1 | 8/2016 | Smith | |
| 9,721,923 B1 | 8/2017 | Shih | |
| 9,741,664 B2 | 8/2017 | Chiu et al. | |
| 9,806,061 B2 | 10/2017 | Shen | |
| 9,893,004 B2* | 2/2018 | Yazdani | H01L 25/0657 |
| 9,929,119 B2 | 3/2018 | Teh et al. | |
| 10,403,599 B2 | 9/2019 | Delacruz et al. | |
| 11,063,017 B2 | 7/2021 | Delacruz et al. | |
| 2002/0001937 A1* | 1/2002 | Kikuchi | H01L 21/4857 |
| | | | 438/618 |
| 2004/0187306 A1* | 9/2004 | Shi | H01L 24/29 |
| | | | 257/E21.503 |
| 2009/0145636 A1* | 6/2009 | Miki | H01L 23/315 |
| | | | 174/255 |
| 2009/0173522 A1 | 7/2009 | Sakamoto et al. | |
| 2009/0231827 A1 | 9/2009 | Furutani et al. | |
| 2011/0133324 A1 | 6/2011 | Fan et al. | |
| 2012/0049375 A1 | 3/2012 | Meyer et al. | |
| 2015/0001717 A1* | 1/2015 | Karhade | H01L 25/0655 |
| | | | 257/741 |
| 2015/0116968 A1 | 4/2015 | Yamada et al. | |
| 2015/0145590 A1* | 5/2015 | Shah | H03K 19/17768 |
| | | | 327/525 |
| 2015/0250058 A1 | 9/2015 | Ramachandran et al. | |
| 2015/0282299 A1* | 10/2015 | Shi | H01L 23/66 |
| | | | 174/250 |
| 2015/0287672 A1 | 10/2015 | Yazdani | |
| 2015/0340353 A1 | 11/2015 | Starkston et al. | |
| 2016/0056087 A1* | 2/2016 | Wu | H01L 25/105 |
| | | | 257/738 |
| 2016/0079219 A1 | 3/2016 | Hosomi | |
| 2016/0211190 A1 | 7/2016 | Braunisch et al. | |
| 2016/0218083 A1 | 7/2016 | Kariyazaki et al. | |
| 2016/0372448 A1* | 12/2016 | Yazdani | H01L 25/50 |
| 2016/0379967 A1* | 12/2016 | Gamini | H01L 25/0652 |
| | | | 257/659 |
| 2017/0040247 A1* | 2/2017 | Shen | H01L 23/49838 |
| 2017/0125331 A1 | 5/2017 | Shen et al. | |
| 2017/0179050 A1 | 6/2017 | Kariyazaki | |
| 2017/0271264 A1* | 9/2017 | Lee | H01L 24/75 |
| 2017/0287872 A1* | 10/2017 | Shen | H01L 23/367 |
| 2018/0098420 A1* | 4/2018 | Kariyazaki | H05K 1/0243 |
| 2018/0102338 A1 | 4/2018 | McLellan | |
| 2018/0261528 A1 | 9/2018 | Chen et al. | |
| 2018/0315735 A1 | 11/2018 | Delacruz et al. | |
| 2019/0206792 A1 | 7/2019 | Collins et al. | |
| 2019/0304936 A1* | 10/2019 | Shaul | H01L 24/20 |
| 2019/0385978 A1 | 12/2019 | Delacruz et al. | |

OTHER PUBLICATIONS

Ishida, Mitsuya, "APX (Advanced Package X)—Advanced Organic Technology for 2.5D Interposer," 2014 CPMT Seminar, Kyocera SLC Technologies Corporation, Shiga Yasu Plant, Japan, IEEE 64th ECTC, Orlando, FL, May 27-30, 2014, 17 pages.

Lenihan, Dr. Timothy G., et al., "Challenges to Consider in Organic Interposer HVM," TechSearch International, Inc., www.techsearchinc.com, iNEMI Substrate & Packaging Workshop, Toyama, Japan, Apr. 21, 2014, 21 pages.

Office Action for U.S. Appl. No. 16/555,127, mailed on Sep. 15, 2020, Delacruz, "Embedded Organic Interposer for High Bandwidth", 17 pages.

Yamada, Tomoyuki, "Organic Interposer and Embedded Substrate," 2015 Packaging Symposium, Kyocera America, Inc., Nov. 2015, 18 pages.

* cited by examiner

*(PRIOR ART)*

*(PRIOR ART)*

EMBEDDED ORGANIC INTERPOSER FOR HIGH BANDWIDTH

RELATED APPLICATIONS

This patent application is a continuation of and claims priority to U.S. patent application Ser. No. 16/555,127, filed Aug. 29, 2019, now U.S. Pat. No. 11,063,017, issued Jul. 13, 2021, which is a continuation of and claims priority to U.S. patent application Ser. No. 15/499,557, filed Apr. 27, 2017, now U.S. Pat. No. 10,403,599, issued Sep. 3, 2019, which are incorporated herein by reference in their entirety.

BACKGROUND

As microelectronic packages become more densely populated with highly integrated components, the increasing integration calls for more individual conductors within each package. Signals must be conducted between ever more sophisticated chips that have more contacts to be connected to, but along smaller lengths of the chip beachfront. While the growing sophistication calls for a fatter data pipe between components to match the higher integration, the overall miniaturization, forces the opposite: the numerous conductors (wires, lines, traces) needed to connect dies, chips, and components to each other must become thinner and more numerous per unit area, or per unit length of beachfront of the chips, to keep pace with the miniaturization. These thinner traces result in a leaner and more constricted data path for individual signals, even though the overall data pipe as a whole has more conductors because they are thinner. At higher density, the traces become skinny, with high resistance and very high capacitance, limiting transmission bandwidth.

These thinner conductive lines, more densely packed and confined between smaller dies and chips, introduce some limitations. For example, a package may require that 10,000 conductive lines be packed into the ever-shrinking real estate of a smaller footprint. This high number of skinny, densely packed conductors must be arrayed at extremely fine pitches. The thinness of the individual conductors and the decreasing amount of dielectric between these finely pitched conductors results in a first-order resistive-capacitive (RC) limitation for transmission of signals across the conductors, especially at higher frequencies. This RC limitation also limits the effective length of these thin and finely pitched conductors, especially when hundreds or thousands of the conductors are layered, ribboned, or bundled to connect high bandwidth dies or chips to each other across even a small distance. The cost effectiveness of adding such fine traces to a package can also be limiting. The fine traces are generally only needed in limited areas, yet the cost burden is carried over to an entire surface based upon a minimum rule set needed for a given layer. The fine pitch routes are also often needed over several layers, not just a single layer, to accommodate the routing needs.

FIG. 1 shows conventional ways to address the limitations introduced above. Conventional rigid and flexible interposers 100, whether made of silicon, glass, polyimide, glass-reinforced epoxy laminate, and other materials, have their drawbacks. Generally, an interposer is a layer or adapter that spreads a connection to a wider pitch or reroutes one connection to a different connection. Conventional interposers are relatively expensive and have a bandwidth limitation. For example, current limitations in rate for high bandwidth memory (HBM2) dynamic random access memory (DRAM) of 1-3 gigatransfer per second (GT/s) per pin and global package bandwidth of 300 gigabytes per second (GB/s) is mainly due to the limitations of conventional interposers. Likewise HBM2 is limited to about 2 GT/s per pin and global package bandwidth of 256 GB/s for the same reason. The low speed per trace in conventional interposers also requires that many traces be used. Conventional silicon or glass interposer solutions are limited in the number of routing layers they can contain, and by their inability to conserve space. Glass can be subject to the same limitations due to the resistance and capacitance of the traces in the wafer process. Silicon is similarly limited.

Embedded multi-die interconnect bridges (EMIBs) 120, such as the EMIBs 120 shown in the flip chip ball grid array (FCBGA) of FIG. 1, are another way to address the bandwidth limitations of skinny conductive lines in highly miniaturized routing layers and conventional interposers (Intel Corporation, Santa Clara, CA). An EMIB 120 can take the form of a bridge between dies, usually disposed in a build-up layer. While less expensive than a full conventional interposer, EMIBs still have a bandwidth limitation near or below 2 GHz due to a large resistive-capacitive (RC) load imposed by limited routing layers on silicon. This RC limitation, in turn, allows only very short transmission routes. Likewise in turn, this also limits the number of devices that can be connected at this high density.

Conventional organic interposers offer yet another attempt at addressing the bandwidth limitations of highly miniaturized conductors. The conventional organic interposers provide improved transmission bandwidth, sometimes up to 40 GHz and beyond, and have good size capabilities, but when they get large, conventional organic interposers warp, and fine-pitch, high density interconnections to a warped surface are difficult. Conventional organic interposers are also limited to only one or two very-high density routing layers situated above the surface of the core layer or conventional build-up layers.

SUMMARY

Embedded organic interposers for high bandwidth are provided. Example embedded organic interposers provide thick conductors with more dielectric space, and more routing layers of such conductors than conventional interposers, in order to provide high bandwidth transmission capacity over longer spans. The embedded organic interposers provide high bandwidth transmission paths between components such as HBM, HBM2, and HBM3 memory stacks, and other components. To provide the thick conductors and more routing layers for greater transmission capacity, extra space is achieved by embedding the organic interposers in the core of the package. Example embedded organic interposers lower a resistive-capacitive (RC) load of the routing layers to provide improved signal transmission of 1-2 GHz up to 20-60 GHz bandwidth for each 15 mm length, for example. The embedded organic interposers are not limited to use with memory modules.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

Figure 1:
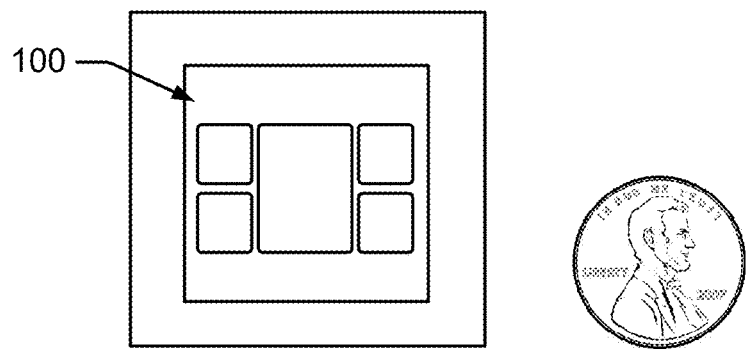
FIG. 1 is a diagram of example conventional interposers.
Figure 1:
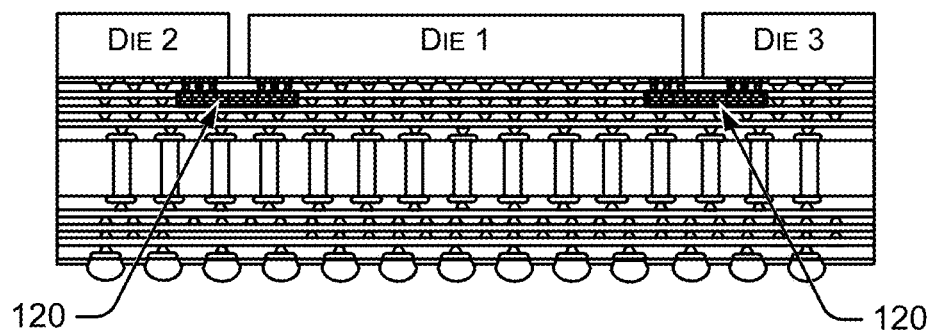
Figure 1:
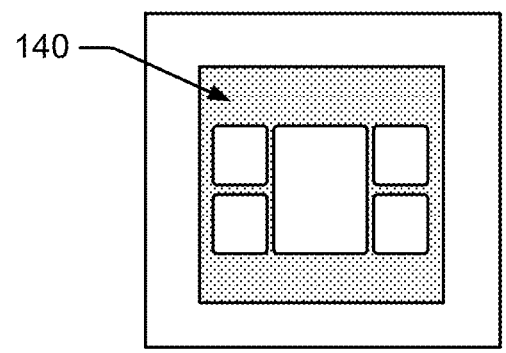

This disclosure describes example embedded organic interposers providing high bandwidth. An example embedded organic interposer includes larger conductors, and more routing layers of such larger conductors, than in conventional interposers. Example embedded organic interposers can also provide more dielectric spacing between conductors, to provide higher bandwidth data pipes than conventional interposers of various types. Each embedded organic interposer aims to provide a high capacity, high bandwidth data path between high bandwidth components, such as high bandwidth memory stacks (HBM, HBM2, HBM3, etc.) and associated components, such as application specific integrated circuit (ASIC) chips of a memory module, memory controllers, and so forth. The embedded organic interposers can be used in numerous types of microelectronic packages.

Example Systems

The example embedded organic interposers provide thicker conductors. To achieve such thick conductors, and also to achieve more routing layers for greater transmission capacity, the extra space needed is achieved by embedding the organic interposers in the core of the package. The extra space also allows thicker dielectric material around conductors, for even greater transmission benefit. This extra transmission capacity and more routing layers, each consisting of thicker conductors, cannot be achieved just by conventional routing layers that are situated conventionally above the core. The example embedded organic interposers lower a resistive-capacitive (RC) load of the routing layers to provide improved signal transmission of up to 20-60 GHz for each 15 mm length of each organic interposer. The embedded organic interposers described herein are not limited to memory modules, but memory is used as an example for the sake of description.

Each example embedded organic interposer can be a separate insert or inlay in a core layer, for example, of a microelectronics package. An embedded organic interposer is inserted, formed, inlaid, or encased (all of these encompassed by the term "embedded") into a space, cavity, indent, or hole in a core layer of a microelectronics package. By contrast, the single monolithic layer (e.g., of silicon) that constitutes conventional interposers, or conventional bridge interposers residing above the core layer, are situated above the core or only in the build-up layers of the microelectronics package above the core layer.

An example embedded organic interposer can be constructed of conductors, such as copper, disposed in various materials, such as high modulus organic materials with low coefficients of thermal expansion (CTE) of around 4 ppm/K CTE, for example. Construction of the example embedded organic interposers can use low cost processes and materials. The organic materials used for example embedded organic interposers can be composites or polymers, an epoxy, glass-reinforced epoxy laminate (e.g., FR4), a bismaleimide-triazine (BT) resin organic material, or other suitable carbon-based or even non-carbon based materials or composites. Thus, "organic" is used loosely herein to differentiate from silicon and pure glass, and as used herein, "organic" also means an inexpensive material with suitable dielectric, tensile modulus, density, and CTE qualities to make an embeddable organic interposer as described below.

Figure 2:
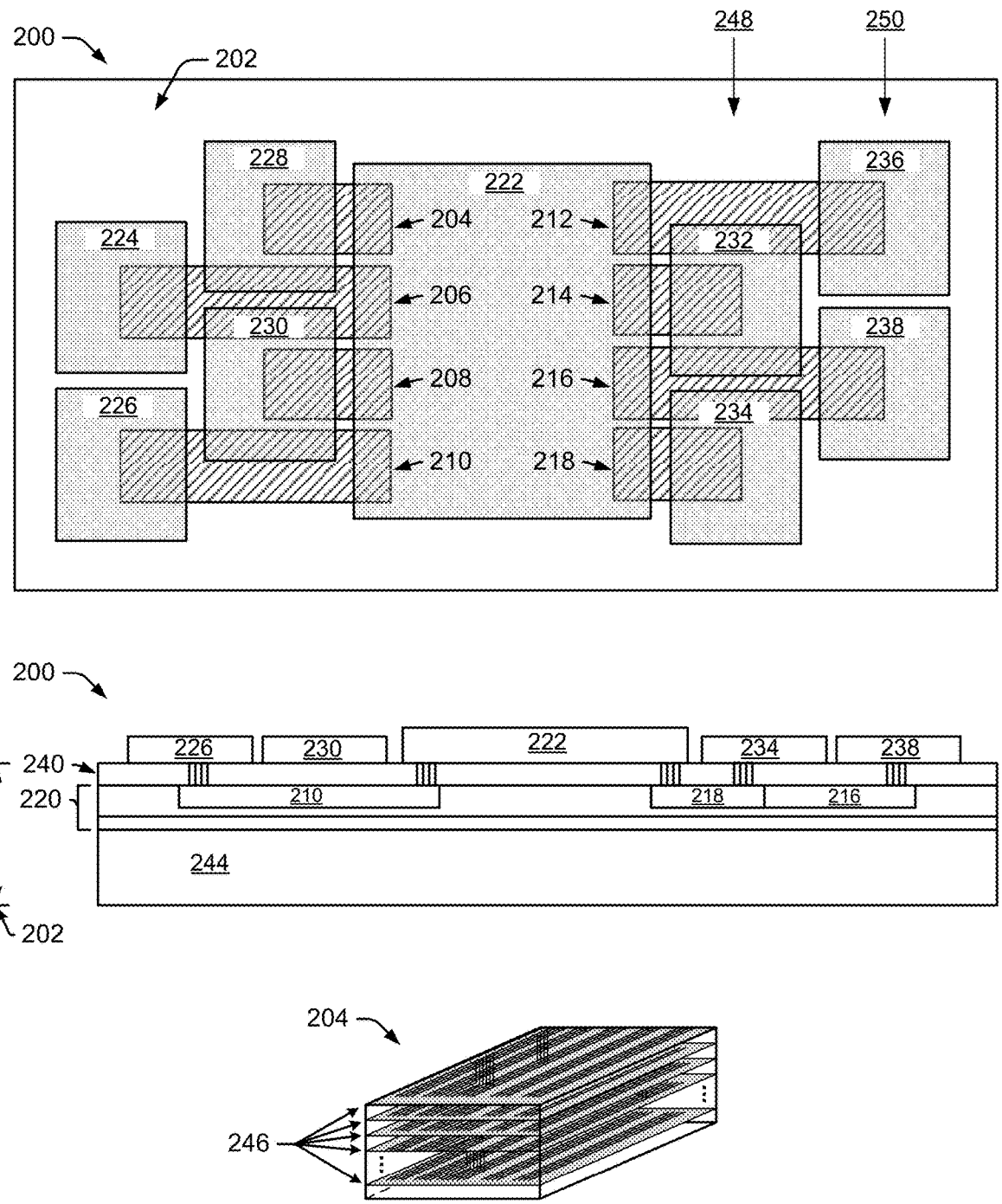
FIG. 2 is a top view and side view of an example microelectronic package, for example a high bandwidth memory module including embedded organic interposers, and a diagram of an embedded organic interposer.

FIG. 2 shows a top view and a side view of an example memory module 200 built on a package substrate 202, with example embedded organic interposers 204 & 206 & 208 & 210 & 212 & 214 & 216 & 218 embedded in a core layer 220, or in core layers, of the package substrate 202. The memory module 200 is used as an example implementation for the sake of description, the embedded organic interposers 204 can also be used in numerous other types of microelectronic packages that are not memory modules. A memory module 200 is an example implementation with a currently-used bump-out that is conducive to the embedded organic interposers 204-218.

In FIG. 2, the core layer 220 may be made of a single sheet of material for embedding the organic interposers 204-218 when the single core layer 220 is thick enough to contain the embedded organic interposers 204-218. Or, the core layer 220 may consist of multiple laminated sheets of glass-epoxy, plastic, Alumina ceramic, and so forth. In an implementation, the core layer 220 can consist of a first core sheet, a cavity punched, drilled, or formed in the first core sheet to a certain depth for embedding the organic interposer 204, and a second core sheet. The first and second core sheets may be laminated together with an adhesive or a dielectric to form the core layer 220 of the microelectronics package, embedding the organic interposer 204 in a process similar to the embedding of capacitors.

In another implementation, the core layer 220 of the package, such as the high bandwidth memory module 200 or other microelectronics package, may consist of a ceramic substrate with cavities or impressions formed in the ceramic substrate. The embedded organic interposer 204 may comprise a layer of an organic substrate applied over the ceramic substrate. The organic substrate can be inlaid in the cavities or impressions of the ceramic substrate, alternating with routing layers in an in situ stack construction of the embedded organic interposer 204, built in place. Or, the organic interposer 204 can be inlaid into a cavity of the ceramic substrate as a premade single unit.

In the example memory module 200, a central component, such as at least one ASIC chip 222 communicates with high bandwidth memory components, such as HBM2 memory stacks 224 & 226 & 228 & 230 & 232 & 234 & 236 & 238 via corresponding embedded organic interposers 204-218. In other types of packages, the central component may be a processor, coprocessor, controller, field-programmable gate array (FPGA), or other integrated circuits or dies. The ASIC chip 222 may also have optional SerDes interfaces onboard. In the example memory module 200, the memory dies of the example HBM2 memory stacks 224 may be 12 mm on a side, and the interface to an embedded organic interposer 204 may be 6 mm wide. Conventionally, this may result in a conventional ASIC with unused beachfront between interface areas on the conventional ASIC. The embedded organic interposers 204-218, however, can allow an ASIC chip 222 to better utilize the borders of the ASIC chip 222, by using most of the beachfront of the ASIC border for connections to the embedded organic interposers 204-218. In other words, the embedded organic interposers 204-218 enable more connections, and more high density connections to more example HBM2 memory stacks 224-238, than allowed by conventional interposers.

The various chip and stack components may be mounted on one or more build-up layers 240 above the core layers 220, and communicatively coupled with the respective embedded organic interposers 204 through vertical vias 242, wires, pins, pads, solder balls, and so forth mediated by the one or more build-up layers 240. The core layer 220 may also have one or more opposing build-up layers 244 on an opposing side of the core layers 220. The embedded organic interposers 204 may also be used to connect non-control and non-processing components together in parallel or in series in various microelectronics packages.

The example embedded organic interposers 204 achieve a high bandwidth of data transmission suitable for HBM, HBM2, HBM3, and so forth, by including numerous routing layers in a vertical stack within the embedded organic interposer 204. For example, an embedded organic interposer 204 may provide at least four or more routing layers 246 within the embedded organic interposer 204 itself, above the core layer(s) 220 and above routing layers native to the core layer(s) 220, before the organic interposer 204 is embedded. Moreover, each routing layer 246 preferably has a line/space that is at least five times the pitch of the pinout density of the ASIC 222 or other processor being connected.

An example high bandwidth memory module 200, constructed as described above, therefore can include at least one core layer 220, an ASIC 222 or logic chip over the core layer 220 or on an intervening build-up layer 240, at least a first row 248 of multiple high bandwidth memory (HBM or HBM2) stacks 232 & 234 adjacent and proximate to the ASIC chip 222 or the logic chip, one or more additional rows 250 of multiple HBM or HBM2 stacks 236 & 238 on a far side of the first row 248 of multiple HBM stacks 232 & 234, the one or more additional rows 250 remote from the ASIC chip 222 or the logic chip and separated from the ASIC chip 222 or the logic chip by the first row 248.

A first set of embedded organic interposers 214 & 218 are embedded in the core layer(s) 220 and connect to each proximate HBM or HBM2 stack 232 & 234 of the first row 248 of stacks with the ASIC chip 222 or the logic chip. Each embedded organic interposer 232 & 234 of the first set has a first length, for example. A second set of organic interposers 212 & 216 embedded in the core layer(s) 220 underpasses the first row 248 of HBM stacks 232 & 234 and connects a respective remote HBM stack 236 & 238 of the one or more additional rows 250 of stacks with the ASIC chip 222 or the logic chip. Each organic interposer 236 & 238 of the second set has a length longer than the first length of the organic interposers 214 & 218 of the first set. In an implementation, the conductive traces in each organic interposer 212 & 214 & 216 & 218 (and the same for the four organic interposers shown on the other side of the ASIC 22) provide at least four vertically stacked routing layers 246 above a core material or a native routing layer of the core layers 220.

As introduced above, the example high bandwidth memory module 200 has conductive traces in the organic interposers 204 with an example pitch of at least five times greater than a beachfront pitch of the ASIC chip 222, the logic chip, or of a HBM stack 228 connected to the routing layers 246 of the embedded organic interposer 204. This beachfront pitch is the pinout density of the ASIC chip 222 or logic chip (or the HBM stack 228), for example, as the aggregate trace count traversing an edge of a component, per unit length.

In an implementation, each embedded organic interposer 204 may have a physical width up to approximately the entire width of a respectively connected HBM (HBM2, HBM3) stack, although FIG. 2 shows a relative width narrower than this. In other implementations, the embedded organic interposer 204 may be as wide as a row of HBM stacks, or even wider.

In an implementation, the conductive traces of the at least four routing layers 246 of each organic interposer 204 are thick enough and/or wide enough to lower a resistive-capacitive (RC) load of the routing layers 246, thereby providing up to 20-60 GHz bandwidth for each 15 mm length of each organic interposer 204.

In an implementation, each routing layer 246 provides a bandwidth performance of greater than 14 GHz with no worse than −5 dB insertion loss per 15 mm length of the routing layer 246. The example embedded organic interposers 204 provide thicker conductors, with greater cross-sectional dimensions of the metal in the conductive traces of the routing layers 246, and more routing layers 246 than in conventional interposers. A transmission line structure of the at least four routing layers 246 may have a tracing space of at least 3 microns (μm) or within a range of 2-10 microns, and dimensions of the conductive traces that include width in the range of 2-10 microns and a thickness in the range of 1-7 microns, per 5-15 mm length of each routing layer 246. The example embedded organic interposers 204 can provide enough conduction capacity to lower the resistive-capacitive (RC) load of the routing layers, providing the high signal transmission bandwidth.

In other implementations that vary from the examples shown in FIG. 2, a first example embedded organic interposer may underpass a second embedded organic interposer in the same core layer. Also, an example embedded organic interposer may divide into multiple branches at one or more places along its length. Or, from another perspective, multiple embedded organic interposers may merge into a single larger bundle of conductors, combining into a single embedded organic interposer.

Figure 3:
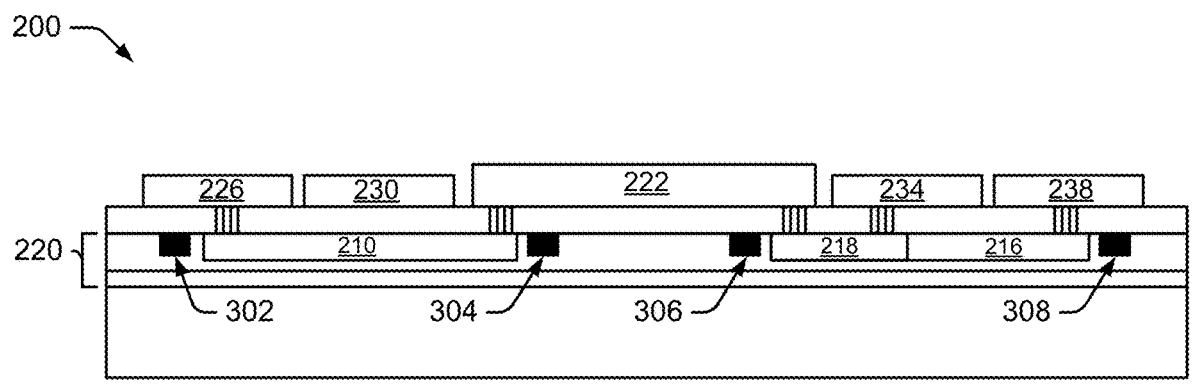
FIG. 3 is a diagram of an example microelectronic package including embedded organic interposers for high bandwidth and embedded chip capacitors.

FIG. 3 shows a side view of an example high bandwidth memory module 300, with chip capacitors 302 & 304 & 306 & 308 (or other electronic components) embedded adjacent to each organic interposer 210 & 216 & 218, for example. The chip capacitors 302-308 can increase a power integrity of the example memory module 300. The chip capacitors 302 can be embedded with the organic interposers 204 for numerous types of microelectronic packages, the embedding of chip capacitors 302 is not limited to memory modules 300. Since cavities are made or formed anyway for the embedded organic interposers 204-218, it can be attractive to place chip capacitors 302-308 too, since it can be very beneficial for the device to have such capacitors at those locations. The chip capacitors 302-308 may be coupling capacitors, for example, with leads connected between power and ground, for example.

Figure 4:
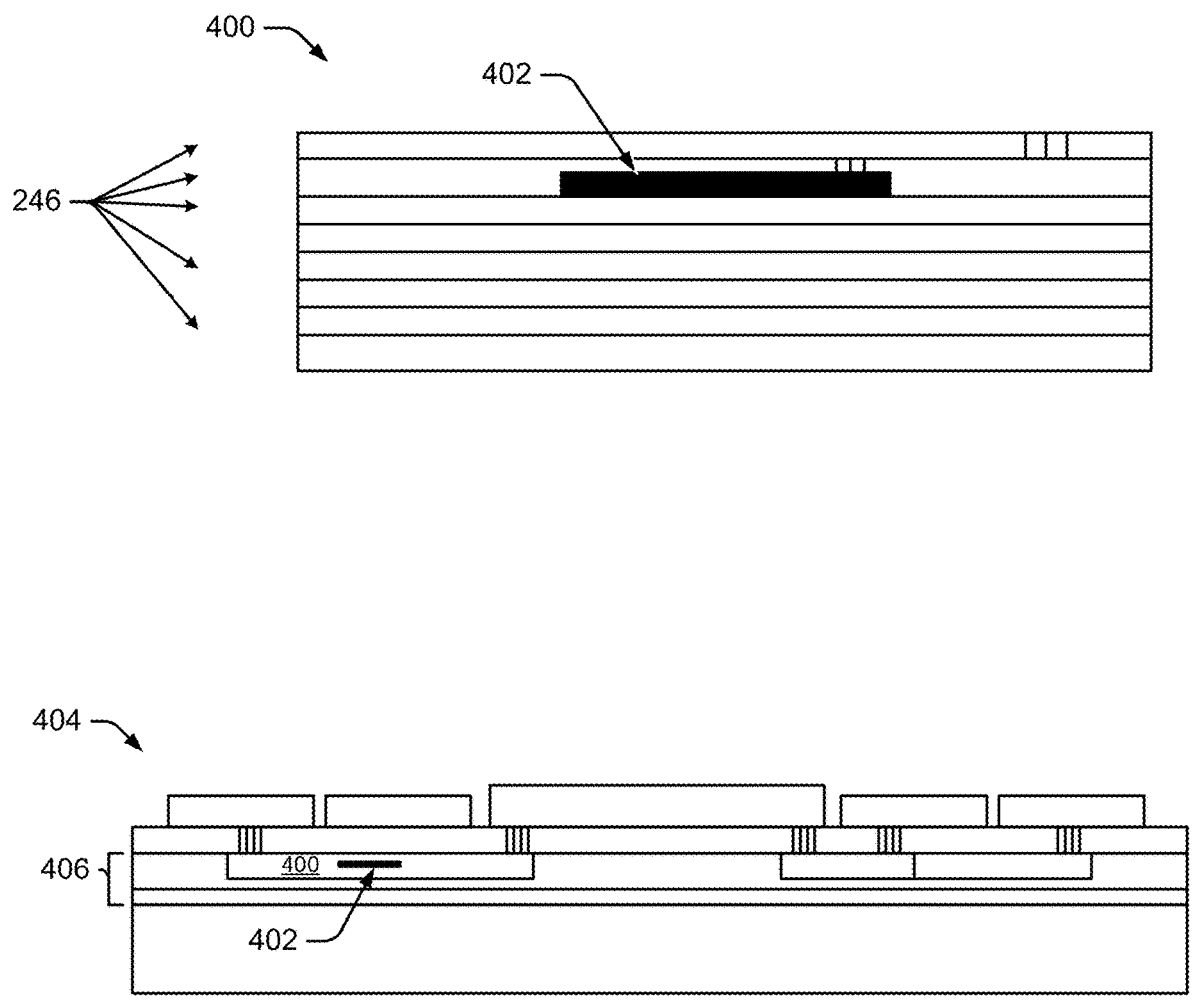
FIG. 4 is a diagram of an example embedded organic interposer with an embedded semiconductor element in the embedded organic interposer.

FIG. 4 shows an example embedded organic interposer 400 with one or more semiconductor cores 402 (or other electronic components) of its own, embedded in the organic interposer 400 itself. The semiconductor core 402 or other component in the organic interposer 400 may be application-specific to the microelectronics package 404 to which the embedded organic interposer 400 is being embedded in a core layer 406 of the same microelectronics package 404. Or, the embedded semiconductor core 402 may be generic to the circuits of a certain class of microelectronic packages to which the particular embedded organic interposer 400 is to be embedded. Or yet again, the embedded semiconductor core 402 or other embedded electronic components may assist or synergize the routing layers 246 of the embedded organic interposer 400 itself.

Figure 5:
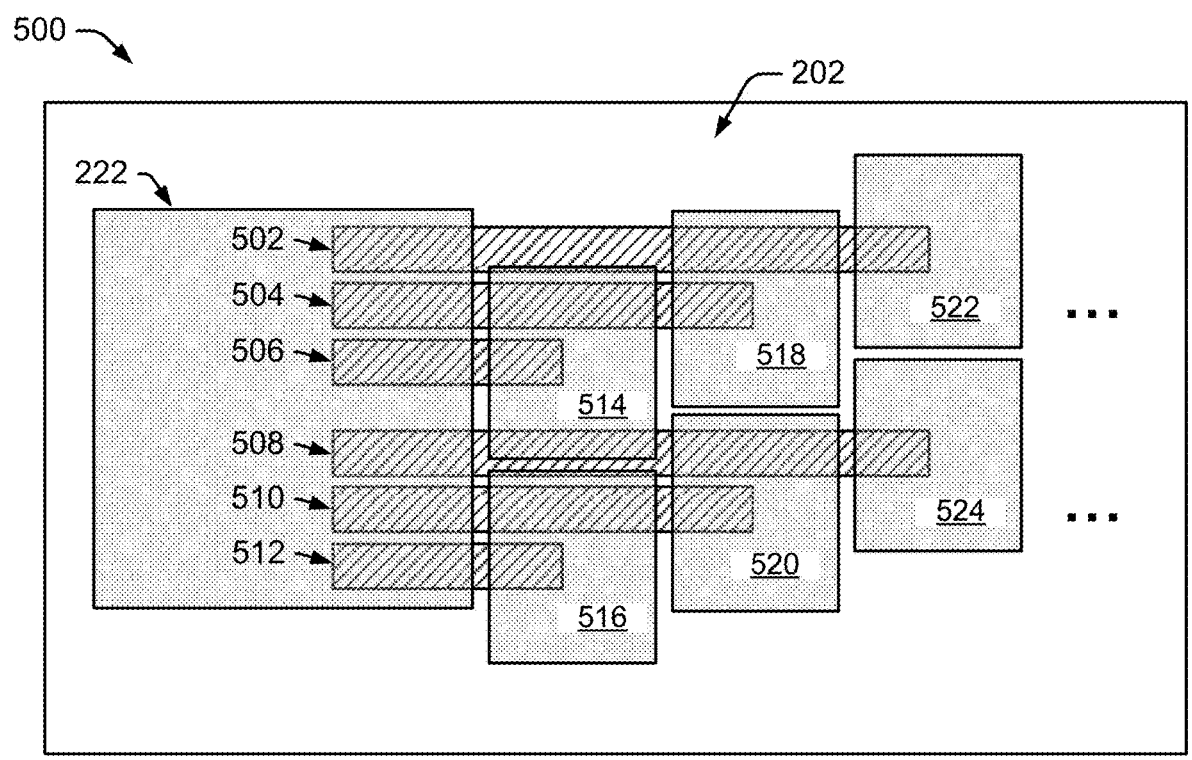
FIG. 5 is a top view diagram of an example package, such as a high bandwidth memory module including embedded organic interposers for high bandwidth, with multiple rows of high bandwidth memory stacks (e.g., HBM2), all on one side of an ASIC.

FIG. 5 shows a top view an example package, such as a memory module 500 built on a package substrate 202, with example organic interposers 502 & 504 & 506 & 508 & 510 & 512 embedded in a core layer 220, or in core layers, of the package substrate 202. The embedded organic interposers 502-512 have various lengths connecting multiple rows of memory components, such as HBM2 memory stacks, at various distances from an ASIC chip 222 of the example memory module 500. The shortest embedded organic interposers 506 & 512 connect a closest row of HBM2 memory stacks 514 & 516 to the ASIC chip 222. Longer embedded organic interposers 504 & 510 connect a middle row of HBM2 memory stacks 518 & 520 to the ASIC chip 222. Another set of embedded organic interposers 502 & 508 are longer yet, and connect a more remote row of HBM2 memory stacks 522 & 524 to the ASIC chip 222.

The example memory module 500 of FIG. 5 illustrates that the rows of memory components may be asymmetrically located to one side of a main ASIC chip 222. FIG. 5 also illustrates that the embedded organic interposers 502-512 can support multiple rows of memory components at various distances from the ASIC chip 222. In FIG. 5, all of the HBM2 memory stacks 514-514 connect to one of the embedded organic interposers 502-512 in the same manner, with an interface area of the HBM2 stacks in a same part of the footprint of each HBM2 stack. Thus, the HBM2 stacks 514-524 are interchangeable in FIG. 5, and FIG. 5 shows one way of arraying the HBM2 memory stacks 514-524 with respect to the embedded organic interposers 502-512. Although three rows of the HBM2 memory stacks are shown in FIG. 5, even more rows of the HBM2 memory stacks could be extended further from the same side of the ASIC chip 222.

Figure 6:
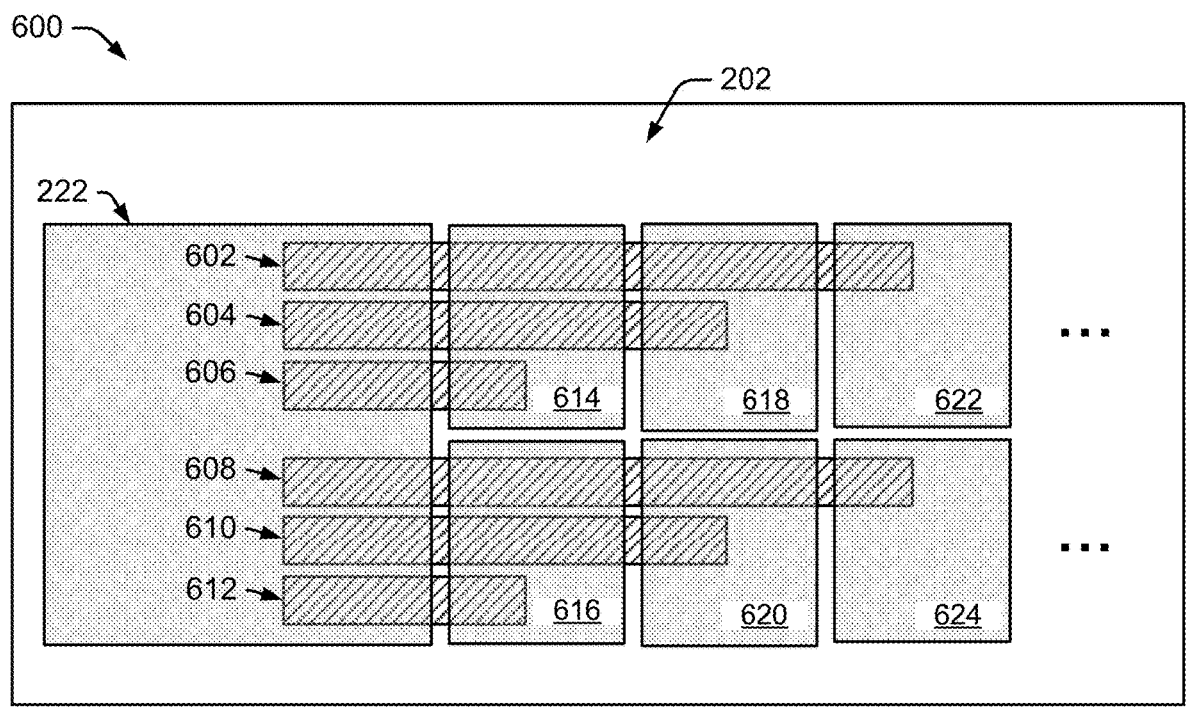
FIG. 6 is a top view diagram of another example package, such as a high bandwidth memory module including embedded organic interposers for high bandwidth, with multiple rows of high bandwidth memory stacks (e.g., HBM2) on one side of an ASIC.

FIG. 6 shows a top view of an example package, such as a memory module 600 built on a package substrate 202, with example embedded organic interposers 602 & 604 & 606 & 608 & 610 & 612 embedded in a core layer 220, or in core layers, of the package substrate 202. The embedded organic interposers 602-612 have various lengths connecting multiple rows of memory components, such as HBM2 memory stacks, at various distances from an ASIC chip 222 of the example memory module 600. The shortest embedded organic interposers 606 & 612 connect a closest row of HBM2 memory stacks 614 & 616 to the ASIC chip 222. Longer embedded organic interposers 604 & 610 connect a middle row of HBM2 memory stacks 618 & 620 to the ASIC chip 222. Another set of embedded organic interposers 602 & 608 are longer yet, and connect a more remote row of HBM2 memory stacks 622 & 624 to the ASIC chip 222.

FIG. 6 as introduced above, shows a space-saving layout of the components, such as theoretical HBM2 memory stacks 614-624, possible when the HBM2 memory stacks can connect to the embedded organic interposers 602-612 at different placements along their interface borders. The HBM2 memory stacks 614-624 may still be interchangeable with each other if each HBM2 memory stack allows connection with an embedded organic interposer 602-612 at three different possible places along a respective interface border of the HBM2 memory stack, for example.

Figure 7:
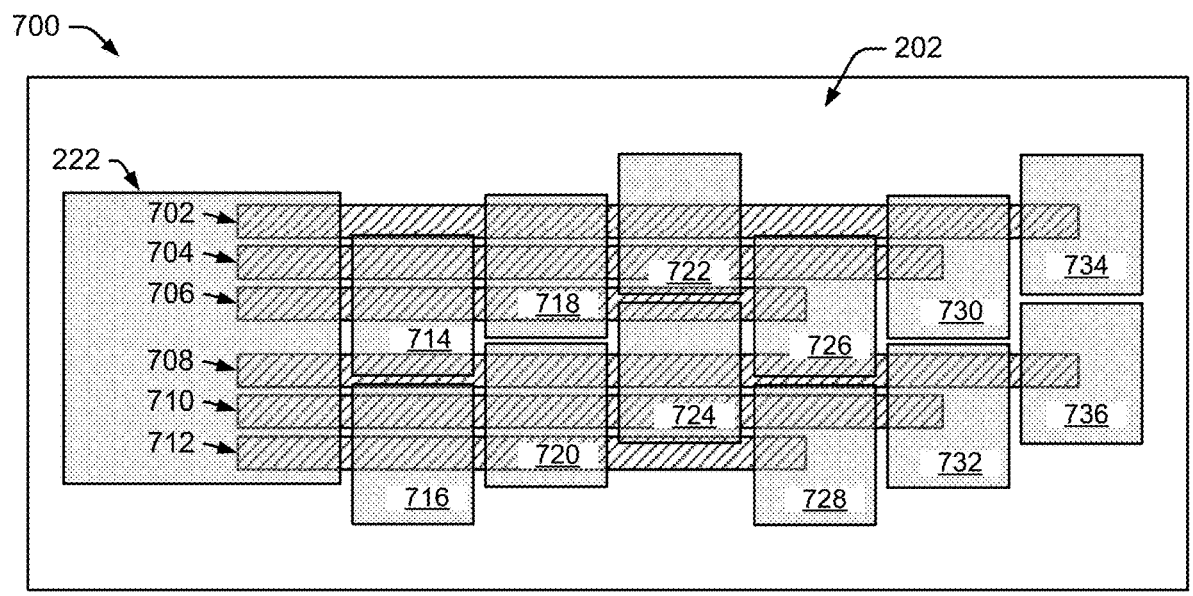
FIG. 7 is a top view diagram of an example package, such as a high bandwidth memory module including embedded organic interposers for high bandwidth, with multiple rows of high bandwidth memory stacks (e.g., HBM2) coupled by each embedded organic interposer to the ASIC.

FIG. 7 shows a top view of another example package, such as a memory module 700 built on a package substrate 202, with example embedded organic interposers 702 & 704 & 706 & 708 & 710 & 712 embedded in a core layer 220, or in core layers, of the package substrate 202. The embedded organic interposers 702-712 have various lengths connecting multiple rows of memory components, such as HBM2 memory stacks, at various distances from an ASIC chip 222 of the example memory module 700.

The shortest embedded organic interposers 706 & 712 connect two rows of HBM2 memory stacks to the ASIC chip 222, a first row that includes HBM2 memory stacks 714 & 716, and a second row that includes HBM2 memory stacks 726 & 728. Longer embedded organic interposers 704 & 710 connect another two rows of HBM2 memory stacks to the ASIC chip 222, a third row that includes HBM2 memory stacks 718 & 720, and a fourth row that includes HBM2 memory stacks 730 & 732. Yet another set of embedded organic interposers 702 & 708 are longer yet, and connect another two rows of HBM2 memory stacks to the ASIC chip

222, a fifth row that includes HBM2 memory stacks 722 & 724, and a sixth row that includes HBM2 memory stacks 734 & 736.

The example memory module 700 of FIG. 7 demonstrates that each embedded organic interposer, such as organic interposer 702, may couple more than one memory component, such as HBM2 memory stacks 722 & 734 to an ASIC chip 222. There are several ways that an example embedded organic interposer 702 can couple multiple components, or multiple instances of the same component, to a central controller, to power and ground, to each other, and to many other components. For example, the example single embedded organic interposer 702 may provide enough bandwidth to make a highly parallel bus for multiple HMB2 (HBM3, etc.) memory stacks 722 & 734, for example. Secondly, the example single embedded organic interposer 702 may provide multiple instances of the same routing layers 246 needed for one component, but on multiple layers or vertical sections of the single embedded organic interposer 702. In other words, if the core layer(s) 220 of the package are deep enough, the embedded organic interposer 702 can also be deep enough to have multilayer redundancy. Thirdly, the ASIC chip 222 may be able to perform multiplexing, time division, frequency splitting, or possess other data handling engines or capabilities that can couple multiple components, or multiple instances of the same component, over the same "shared" conductive traces of the same routing layers 246.

Figure 8:
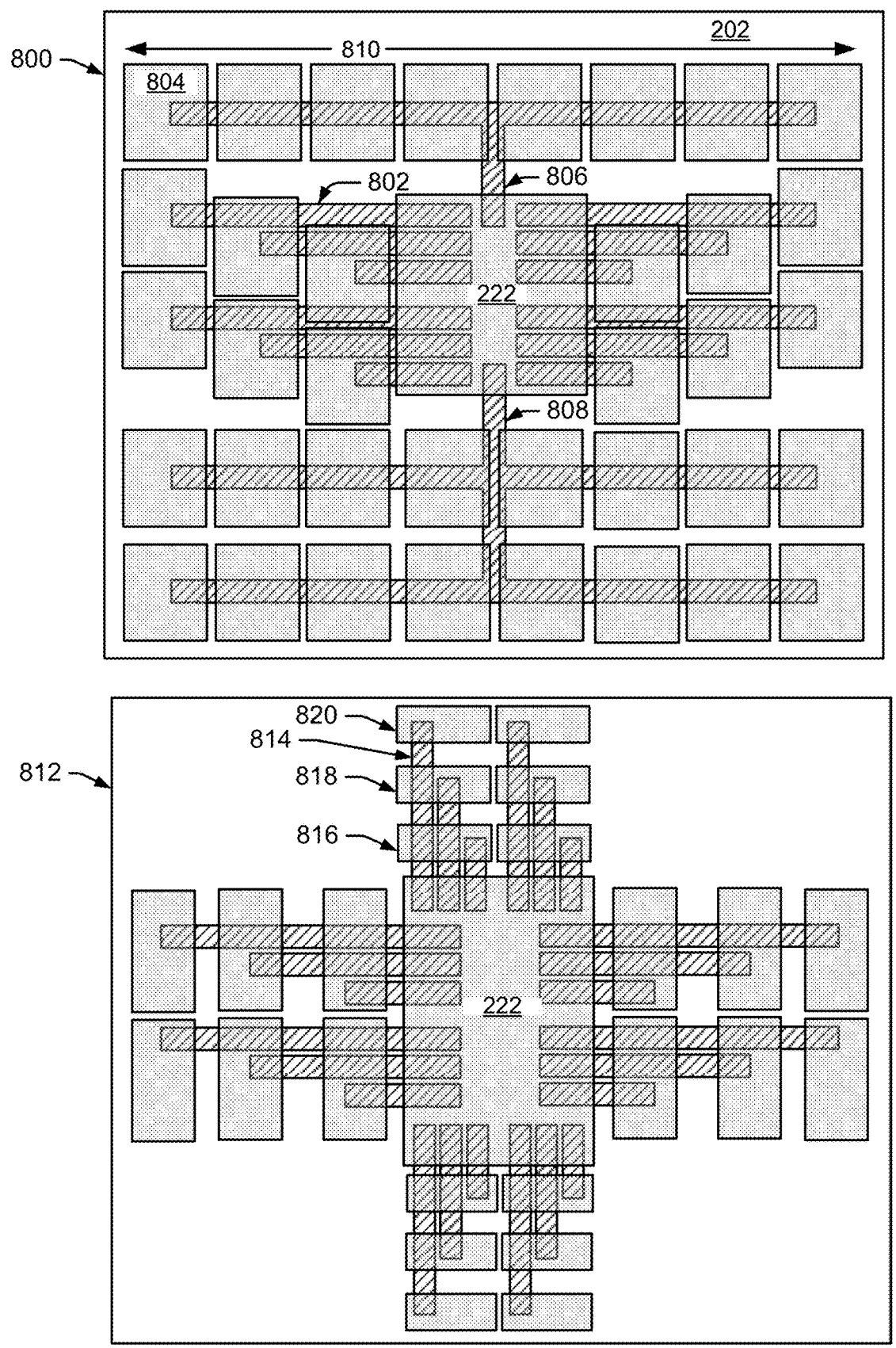
FIG. 8 is a top view diagram of example packages, such as high bandwidth memory modules including embedded organic interposers for high bandwidth, with rows of high bandwidth memory stacks (e.g., HBM2) on all sides of an ASIC, coupled to the ASIC by straight and branching embedded organic interposers, each single interposer coupling multiple HBM2 stacks, or underpassing one or more stacks to connect to a furthest component or die stack.

FIG. 8 shows top views of example packages, such as memory modules 800 and 812, similar to the memory module 500 of FIG. 5, but with embedded organic interposers, such as organic interposer 802, and HBM2 memory stacks, such as HBM2 memory stack 804, disposed on all sides of an ASIC chip 222. FIG. 8 demonstrates that the number of components, such as memory components or HBM2 memory stacks, that can be arrayed in an example memory module 800 is limited only by the ASIC chip 222 or by other layout considerations, and not necessarily by the number of embedded organic interposers 802 or the number of HBM2 memory stacks arrayed. In an implementation, the multiple memory stacks can be arrayed on all sides of a central ASIC chip 222 or other main chip.

An example embedded organic interposer, such as interposer 806 may branch along its length. Likewise, an example embedded organic interposer 808 may also branch multiple times along its length. A single embedded organic interposer 806 may couple an entire row 810 of memory stacks 804, or a single embedded organic interposer 808 may couple multiple entire rows of the memory stacks. Thus, an embedded organic interposer, such as interposer 806, may have at least one part that is as wide as a row 810 of memory stacks. The embedded organic interposers 806 & 808 may also contain bends, angles, and other types of branches along their lengths. In general, the embedded organic interposers do not have to be straight or contain only straight conductors.

Example device 812 has a central logic chip, central ASIC chip, or central control chip 222 with instances of the embedded organic interposers 814 having access to the central control chip 222 on all edges of the chip 222, for example, on all four sides of the central control chip 222. The example high bandwidth embedded organic interposers 814 can underpass components, such as die stacks 816 & 818 to connect to a furthest component or die stack 820.

Figure 9:
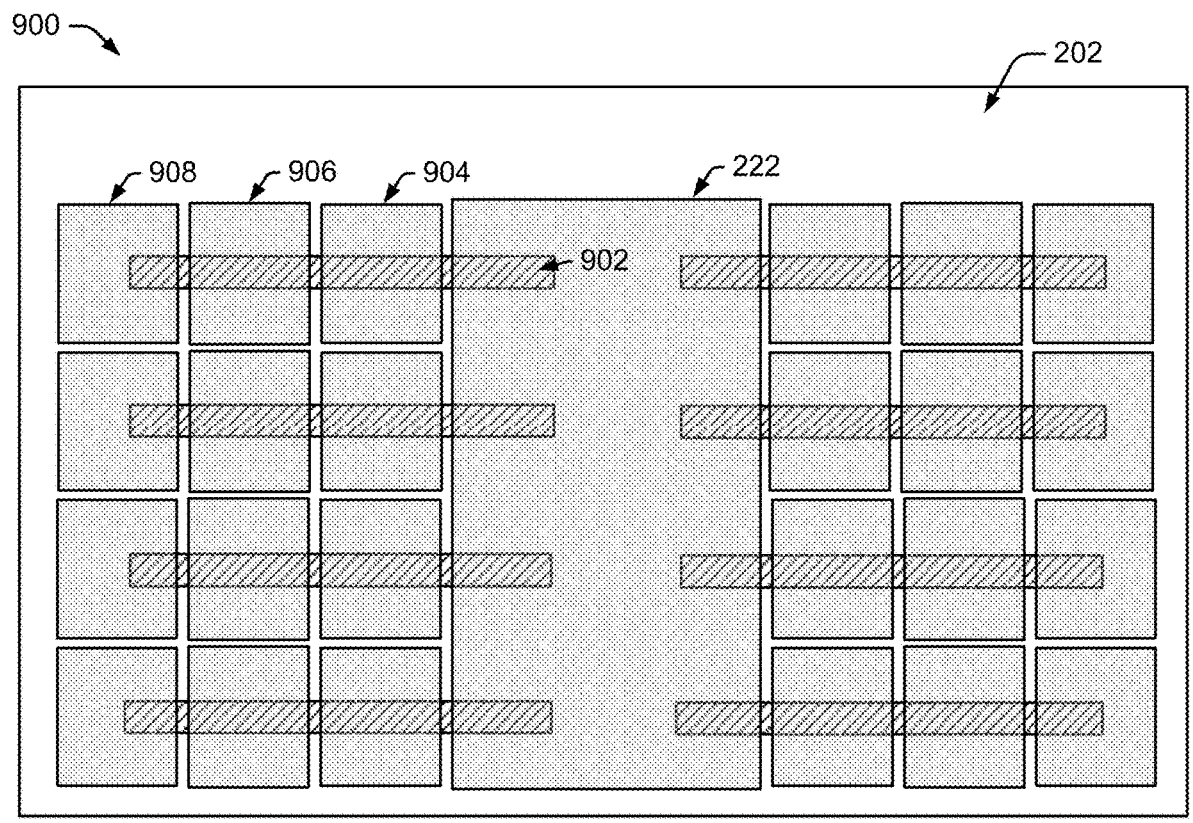
FIG. 9 is a top view diagram of an example package, such as a high bandwidth memory module including embedded organic interposers for high bandwidth, with multiple rows of high bandwidth memory stacks (e.g., HBM2) on two sides of an ASIC in a closest-packed layout with each embedded organic interposer coupling multiple high bandwidth memory stacks (e.g., HBM2) to the ASIC.

FIG. 9 shows a top view of another example package, such as a memory module 900 built on a package substrate 202, with example embedded organic interposers 902 embedded in a core layer 220, in multiple core layers, or on one or more core layers, of the package substrate 202, similar to the preceding Figures. Each single embedded organic interposer 902 may serve multiple components, such as multiple memory stacks 904 & 906 & 908. FIG. 9 demonstrates maximizing the real estate of a package substrate 202 by using a limited number of the embedded organic interposers 902 to implement a closest-packed array of memory components, such as HBM2 memory stacks, around a central ASIC chip 222. The multiple embedded organic interposers employed in the closest-packed array can be less expensive than a single monolithic conventional interposer, and provide higher transmission bandwidth than a conventional interposer, and in addition, do not occupy an entire extra layer, as a conventional monolithic interposer would do.

Figure 10:
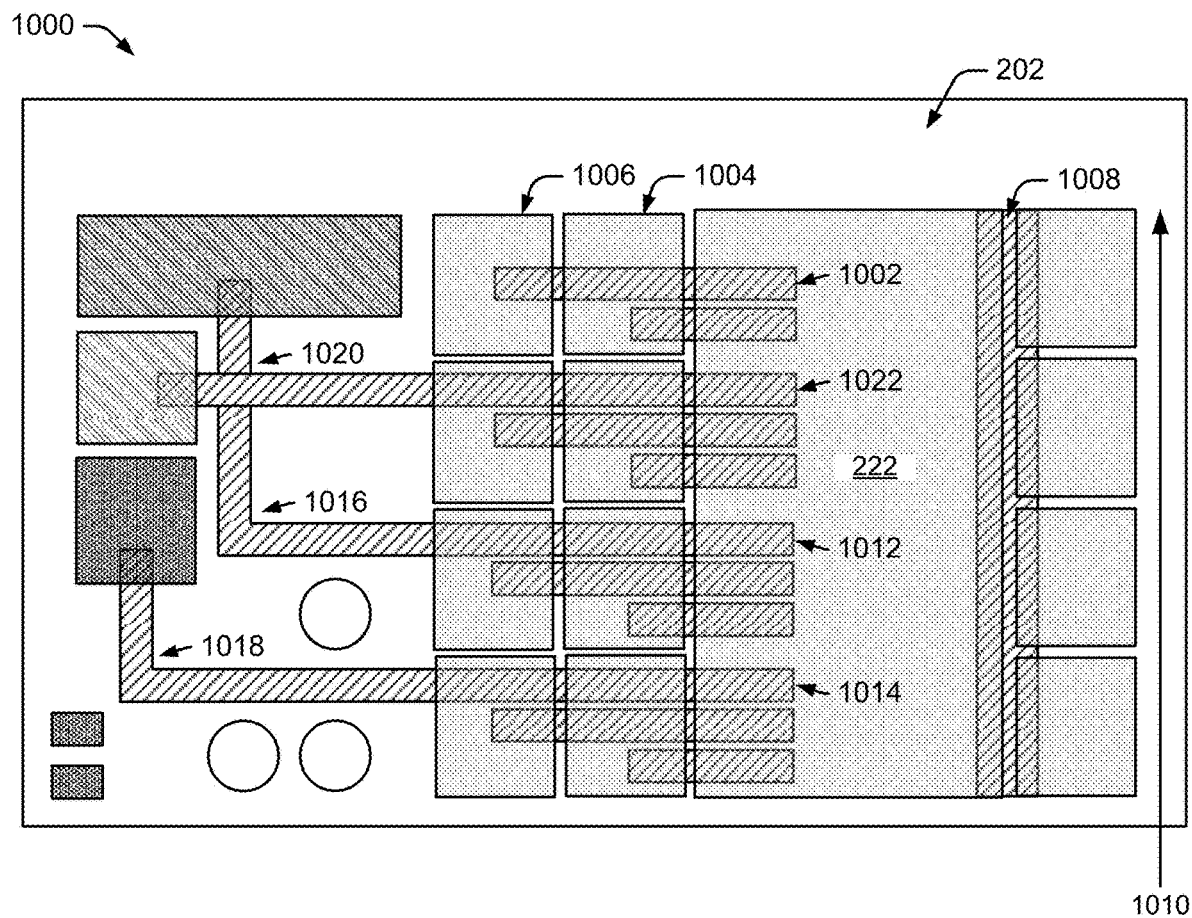
FIG. 10 is a top view diagram of an example package, such as a high bandwidth memory module including embedded organic interposers for high bandwidth, with rows of high bandwidth memory stacks (e.g., HBM2) on two sides of an ASIC, with various embedded organic interposers, including a wide interposer, interposers with bends, and an interposer that underpasses another interposer.

FIG. 10 shows a top view of another example package, such as a memory module 1000 built on a package substrate 202, with example embedded organic interposers, such as interposer 1002 embedded in a core layer 220, or in core layers, of the package substrate 202. As in the preceding Figures, the embedded organic interposers 1002 can each couple multiple components, such as multiple instances of a memory component or multiple HBM2 memory stacks 1004 & 1006, to the ASIC chip 222. Such organic interposers 1002 can provide enough bandwidth to make a highly parallel bus, or can provide multiple instances of the same routing layers 246 in multiple layers sufficient for multiple instances of a component, or can enable multiplexing, time division, frequency splitting, or other data handling schemes that can couple multiple instances of the same component using the same routing layers 246, given the high transmission bandwidth of the example embedded organic interposers 1002. The multiple embedded organic interposers 1002 can be less expensive than a single monolithic conventional interposer, because of less expensive materials may be used, while providing higher transmission bandwidth than a conventional interposer, and while not occupying an entire extra layer, as conventional monolithic interposers do.

In an implementation, an example embedded organic interposer 1008 may be as wide as interfaces on an ASIC chip 222 or other central chip or controller, and/or as wide as multiple connected components, such as a row 1010 of memory modules.

In an implementation, example embedded organic interposers 1012 & 1014 may also include bends or angles 1016 & 1018, not only in the x-y plane, but also in the x-z and y-z planes of the given substrate 202 or core 220.

In an implementation, a given embedded organic interposer 1012 may also underpass or cross under (or over) a different instance of the embedded organic interposer 1022.

Figure 11:
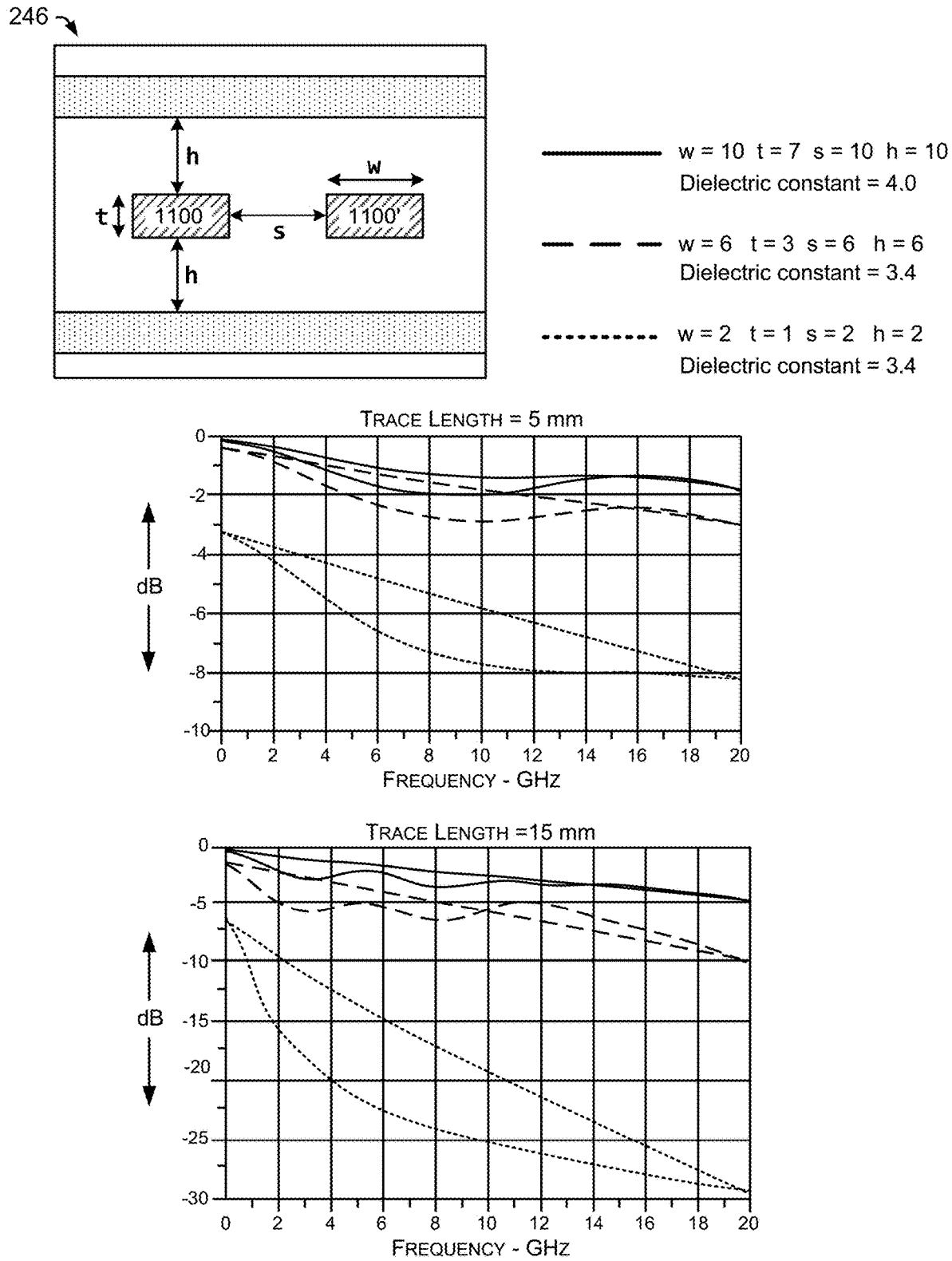
FIG. 11 is a diagram of cross-sectional dimensions of two conductive traces disposed in a single routing layer of an example embedded organic interposer for high bandwidth, and two graphs of insertion loss with decibels (−dB) plotted against signal frequency, illustrating how changes in the dimensions of the conductive traces affect the bandwidth of signal transmission over different lengths of the conductive traces.

FIG. 11 shows cross-sectional dimensions of two conductive traces 1100 & 1100' disposed in a single routing layer 246 of an example embedded organic interposer 204 for high bandwidth, illustrating how changes in the dimensions of the conductive traces 1100 & 1100' affect the bandwidth of signal transmission over different lengths of the conductive traces 1100 & 1100'.

Each routing layer may have a transmission line structure of the conductive traces with a tracing space of at least 3 microns (μm) or within a range of 2-10 microns, and dimensions of the conductive traces comprising a width in the range of 2-10 microns and a thickness in the range of 1-7 microns, per 5-16 mm length of each routing layer.

In FIG. 11, s is the trace spacing between two conductive traces 1100 & 1100', w is the width of each conductive trace 1100 & 1100', t is the thickness of each conductive trace 1100 & 1100', and h is the minimum height or thickness of a dielectric layer above and below the conductive traces 1100 & 1100'.

The two graphs in FIG. 11 show decibels (−dB) of insertion loss plotted against signal frequency in GHz. Insertion loss per signal frequency is shown for conductive traces in several cases: (case 1) where width=10 μm, thickness=7 μm, trace spacing=10 μm, and dielectric height=10 μm, with a dielectric constant of 4.0; (case 2) where width=6 μm, thickness=3 μm, trace spacing=6 μm, and dielectric height=6 μm, with a dielectric constant of 3.4; and (case 3) where width=2 μm, thickness=1 μm, trace spacing=2 μm, and dielectric height=2 μm, with a dielectric constant of 3.4. These three cases are plotted for conductive trace lengths of 5 mm and 15 mm in FIG. 11.

When the trace dimensions increase from 2 μm×1 μm to 6 μm×3 μm, the insertion loss is reduced by a factor of 3 (3× reduction of insertion loss). When the trace dimensions further increase in turn, from 6 μm×3 μm to 10 μm×7 μm, the insertion loss is reduced by an additional 50%. Thus, when the trace dimensions increase from 2 μm×1 μm to 10 μm×7 μm, the insertion loss is reduced by a factor of 6 (6× reduction of insertion loss).

Referring to FIG. 11 and also to FIG. 2, in an implementation of an example high bandwidth memory module 200 using HBM2 memory stacks 228, a short embedded organic interposer 204 servicing an HBM2 memory stack 228 proximate to an ASIC chip 222 may operate at high speeds of 1-2 GHz and can go to extremely high speeds of as high as 20-60 GHz. An embedded organic interposer 206 with longer length to underpass a proximate HBM2 memory stack 228 to couple with a more remote HBM2 memory stack 224 may be 15 mm in length with current example dimensions of an HBM2 memory stack 228, with comparable transmission bandwidth.

Example Methods

Figure 12:
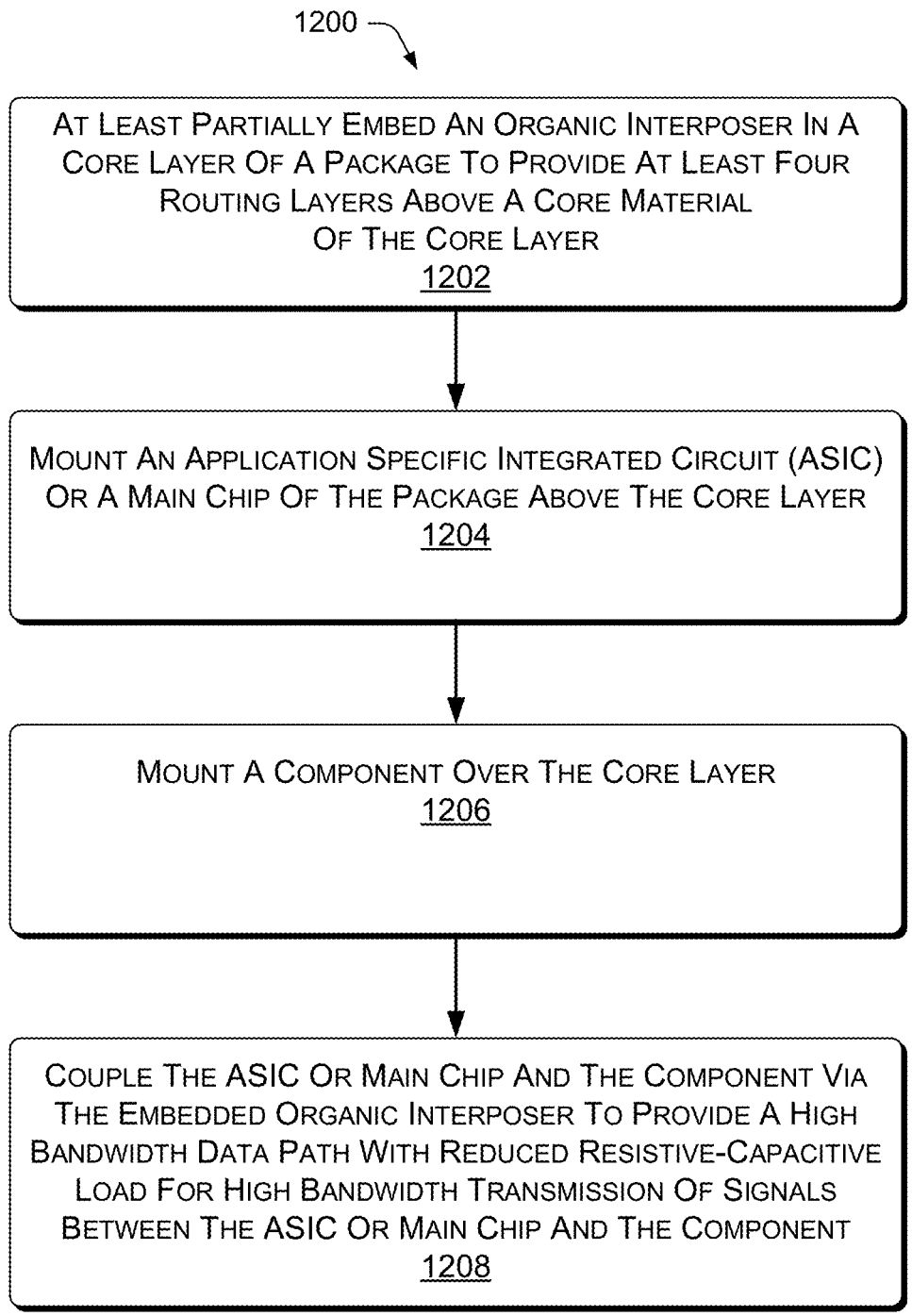
FIG. 12 is an example method of constructing a microelectronics package, for example a high bandwidth memory module, with embedded organic interposers for high bandwidth signal transmission.

FIG. 12 shows an example method 1200 of constructing a microelectronics package, for example a high bandwidth memory module, with embedded organic interposers for high bandwidth signal transmission. In the flow diagram of FIG. 12, the operations of the example method 1200 are shown in individual blocks.

At block 1202, an organic interposer is at least partially embedded in a core layer of a microelectronics package, such as a high bandwidth memory module, to provide at least four routing layers above a core material of the core layer.

At block 1204, a main or central die or chip, such as an application-specific integrated circuit (ASIC) chip, is mounted above the core layer of the microelectronics package.

At block 1206, an electronics component, such as a high bandwidth memory stack (HBM, HBM2, HBM3 . . . ) is mounted above the core layer of the microelectronics package.

At block 1208, the main or central chip and the electronics component, for example the ASIC and an HBM2 stack, are coupled via the embedded organic interposer to provide a high bandwidth data path with reduced resistive-capacitive (RC) load, for high bandwidth signal transmission between the main chip and the component, or between the ASIC and the HBM2 stack.

In an implementation, the example method 1200 can include embedding the organic interposer to underpass a first electronic component in order to couple with a second, more remote, electronic component. Thus, in an implementation, an example method may include mounting a first HBM2 stack and a second HBM2 stack on the core layer, connecting the first HBM2 stack to the ASIC via a first instance of the organic interposer, and underpassing the first HBM2 stack with a second instance of the organic interposer to connect the second HBM2 stack to the ASIC via the second instance of the organic interposer.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

The invention claimed is:

1. A microelectronic apparatus, comprising:
   a substrate comprising at least one core layer, the at least one core layer comprising an inorganic material;
   an interposer for electrically connecting microelectronic components, the interposer comprising:
      a plurality of parallel organic dielectric layers; and
      a plurality of routing layers, each of the routing layers disposed between adjacent ones of the organic dielectric layers, each of the routing layers comprising horizontal traces, wherein:
         the interposer is embedded in the at least one core layer, the at least one core layer and the interposer defining a horizontal substrate surface that is parallel to the horizontal traces; and
         each horizontal trace comprises a conductor having a cross-section for providing a data transfer rate of at least 1 gigabit per second between a first microelectronic component and a second microelectronic component; and
   a build-up layer disposed vertically adjacent to the horizontal substrate surface, wherein the build-up layer comprises conductors for connecting the microelectronic components to the horizontal traces.

2. The microelectronic apparatus of claim 1, wherein the organic dielectric layers comprise an organic polymer.

3. The microelectronic apparatus of claim 1, wherein the organic dielectric layers comprise an epoxy or a glass-reinforced epoxy laminate.

4. The microelectronic apparatus of claim 1, wherein the organic dielectric layers comprise a bismaleimide-triazine resin.

5. The microelectronic apparatus of claim 1, wherein the organic dielectric layers are free from silicon.

6. The microelectronic apparatus of claim 1, wherein the horizontal traces and the conductors connect two or more microelectronic components disposed on the build-up layer.

7. The microelectronic apparatus of claim 1, wherein the core layer comprises ceramic.

8. The microelectronic apparatus of claim 1, wherein the horizontal traces have a cross-sectional width of 2-10 microns parallel to the horizontal substrate surface.

9. The microelectronic apparatus of claim 1, wherein the parallel organic dielectric layers have a thickness of 2-10 microns orthogonal to the horizontal substrate surface.

10. The microelectronic apparatus of claim 1, wherein the microelectronic components are memory stacks.

11. The microelectronic apparatus of claim 1, wherein the interposer comprises a laminate stack of parallel and interleaved organic dielectric layers and routing layers.

12. The microelectronic apparatus of claim 1, further comprising:
a capacitor embedded in the at least one core layer, the capacitor being horizontally adjacent to the interposer.

13. The microelectronic apparatus of claim 1, wherein a pitch between horizontal traces in the routing layer is 2-10 microns and portions of the organic dielectric layers are disposed between the horizontal traces.

14. The microelectronic apparatus of claim 13, wherein the horizontal traces have a cross-sectional thickness of 1-7 microns orthogonal to the horizontal substrate surface.

15. A microelectronic apparatus comprising:
an interposer embedded in a core layer of the microelectronic apparatus, the interposer and the core layer defining a horizontal surface, the interposer comprising:
a plurality of parallel organic dielectric layers; and
a plurality of routing layers, each of the routing layers disposed between adjacent ones of the organic dielectric layers, and each of the routing layers comprising horizontal traces, wherein:
each horizontal trace comprises a conductor having a cross-section for providing a data transfer rate of at least 1 gigabit per second between a first microelectronic component and a second microelectronic component; and
the horizontal traces are parallel to the horizontal surface; and
a build-up layer disposed vertically adjacent to the horizontal surface, wherein the build-up layer comprises conductors for connecting the first and second microelectronic components to the horizontal traces.

16. The interposer of claim 15, wherein the organic dielectric layers comprise an organic polymer, an epoxy, a glass-reinforced epoxy laminate or a bismaleimide-triazine resin.

17. The interposer of claim 15, wherein the horizontal traces have a cross-sectional thickness of 1-7 microns orthogonal to a horizontal interposer surface.

18. The interposer of claim 15, wherein the horizontal traces have a cross-sectional width of 2-10 microns parallel to a horizontal interposer surface.

* * * * *